(12) United States Patent
Darabi

(10) Patent No.: US 7,904,042 B2
(45) Date of Patent: Mar. 8, 2011

(54) FAST IMAGE REJECTION

(75) Inventor: Hooman Darabi, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 631 days.

(21) Appl. No.: 12/028,436

(22) Filed: Feb. 8, 2008

(65) Prior Publication Data

US 2009/0203342 A1    Aug. 13, 2009

(51) Int. Cl.
*H04B 17/00* (2006.01)

(52) U.S. Cl. .................. 455/226.2; 455/313; 455/552.1

(58) Field of Classification Search .................. 455/131, 455/226.1, 226.2, 302, 313, 552.1, 553.1
See application file for complete search history.

(56) References Cited

U.S. PATENT DOCUMENTS

| | | | |
|---|---|---|---|
| 6,510,317 B1 * | 1/2003 | Marko et al. | 455/428 |
| 6,766,178 B1 * | 7/2004 | Damgaard et al. | 455/552.1 |
| 7,596,195 B2 * | 9/2009 | Pan | 375/350 |

* cited by examiner

*Primary Examiner* — Quochien B Vuong
(74) *Attorney, Agent, or Firm* — Garlick Harrison & Markison; Shayne X. Short

(57) ABSTRACT

Fast image rejection. Dual down conversion processing of a received signal by performing both low side injection and high side injection thereby generating a first down converted signal and a second down converted signal. Analysis of one or both of the first and second down converted signals, including the signal and image components thereof, is performed to determine which of the first down converted signal and the second down converted signal is appropriate to be selected for subsequent baseband processing. For example, if a signal strength of an image within the first down converted signal is less than a signal strength of a signal component within the first down converted signal, then the first down converted signal is most likely the appropriate signal to undergo baseband processing. Alternatively, if the converse is true, then the second down converted signal may be the appropriate signal to undergo baseband processing.

20 Claims, 6 Drawing Sheets

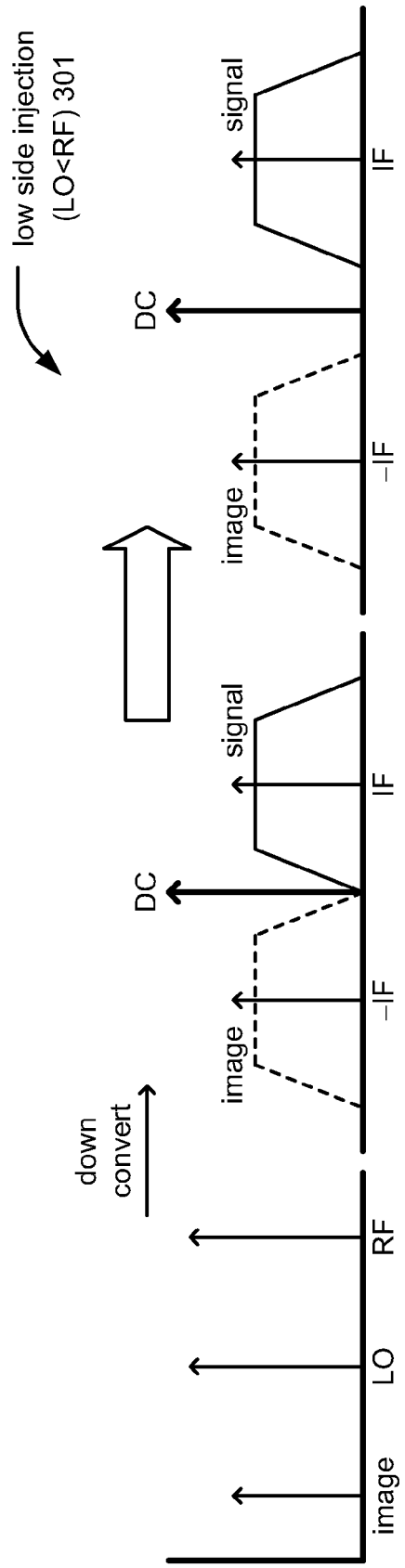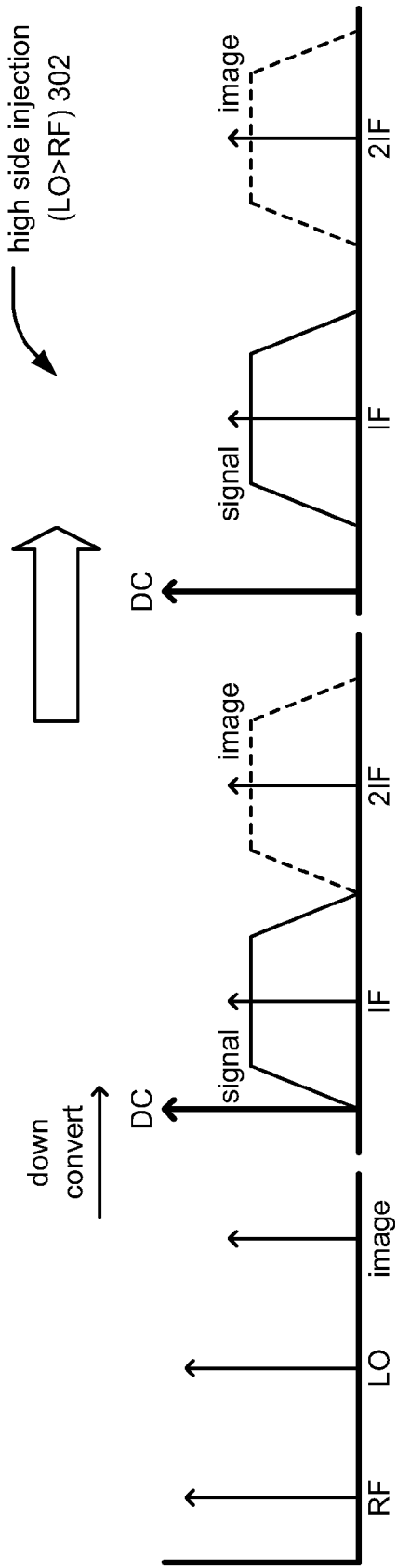
Fig. 3A
Fig. 3B

FAST IMAGE REJECTION

CROSS REFERENCE TO RELATED PATENTS/PATENT APPLICATIONS

Incorporation by Reference

The following related U.S. Utility Patent Application, being filed concurrently, is hereby incorporated herein by reference in its entirety and is made part of the present U.S. Utility Patent Application for all purposes:

1. U.S. patent application Ser. No. 12/028,464, entitled "Selective fast image rejection," filed Feb. 8, 2008, pending.

BACKGROUND OF THE INVENTION

1. Technical Field of the Invention

The invention relates generally to communication systems; and, more particularly, it relates to processing of signals received by communication devices within such communication systems.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), radio frequency identification (RFID), Enhanced Data rates for GSM Evolution (EDGE), General Packet Radio Service (GPRS), and/or variations thereof.

Depending on the type of wireless communication system, a wireless communication device, such as a cellular telephone, two-way radio, personal digital assistant (PDA), personal computer (PC), laptop computer, home entertainment equipment, RFID reader, RFID tag, et cetera, communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system or a particular RF frequency for some systems) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to an antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is also known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

While transmitters generally include a data modulation stage, one or more IF stages, and a power amplifier, the particular implementation of these elements is dependent upon the data modulation scheme of the standard being supported by the transceiver. For example, if the baseband modulation scheme is Gaussian Minimum Shift Keying (GMSK), the data modulation stage functions to convert digital words into quadrature modulation symbols, which have a constant amplitude and varying phases. The IF stage includes a phase locked loop (PLL) that generates an oscillation at a desired RF frequency, which is modulated based on the varying phases produced by the data modulation stage. The phase modulated RF signal is then amplified by the power amplifier in accordance with a transmit power level setting to produce a phase modulated RF signal.

As another example, if the data modulation scheme is 8-PSK (phase shift keying), the data modulation stage functions to convert digital words into symbols having varying amplitudes and varying phases. The IF stage includes a phase locked loop (PLL) that generates an oscillation at a desired RF frequency, which is modulated based on the varying phases produced by the data modulation stage. The phase modulated RF signal is then amplified by the power amplifier in accordance with the varying amplitudes to produce a phase and amplitude modulated RF signal.

As yet another example, if the data modulation scheme is x-QAM (16, 64, 128, 256 quadrature amplitude modulation), the data modulation stage functions to convert digital words into Cartesian coordinate symbols (e.g., having an in-phase signal component and a quadrature signal component). The IF stage includes mixers that mix the in-phase signal component with an in-phase local oscillation and mix the quadrature signal component with a quadrature local oscillation to produce two mixed signals. The mixed signals are summed together and filtered to produce an RF signal that is subsequently amplified by a power amplifier.

As the desire for wireless communication devices to support multiple standards continues, recent trends include the desire to integrate more functions on to a single chip. However, such desires have gone unrealized when it comes to implementing baseband and RF on the same chip for multiple wireless communication standards. In addition, many components and/or modules within the components employed within such communication devices and wireless communication devices include many off-chip elements.

The frequency to which a received signal is down converted in such an IF stage largely affect certain characteristics of the down converted signal. For example, when down converting the received signal to a higher IF can help alleviate or at least reduce some of the problems generally associated with lower down conversion frequencies (e.g., flicker, DC offset, etc.). However, with respect to other issues, such as image rejection, a relatively higher IF can be more desirable and beneficial. As can be seen, the frequency to which a received signal is down converted can significantly affect many subsequent issues including the properties of the signal at the IF and/or a subsequent baseband signal generated from the IF signal.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWINGS

FIG. 3A is a diagram illustrating an embodiment of low side injection when performing down conversion of a received signal.

FIG. 3B is a diagram illustrating an embodiment of high side injection when performing down conversion of a received signal.

DETAILED DESCRIPTION OF THE INVENTION

A novel approach of performing image rejection is presented herein in which dual down conversion processing of a received signal is made to generate a first down converted signal and a second down converted signal. The first down converted signal can be generated via low side injection, and the second down converted signal can be generated via high side injection.

Analysis of one or both of the first down converted signal and the second down converted signal, including the signal and image components thereof, is performed to determine which of the first down converted signal and the second down converted signal is appropriate to be selected for subsequent baseband processing.

For example, if a signal strength of an image within the first down converted signal is less than a signal strength of a signal component within the first down converted signal, then the first down converted signal is most likely the appropriate signal to undergo baseband processing. Alternatively, if a signal strength of an image within the second down converted signal is less than a signal strength of a signal component within the second down converted signal, then the second down converted signal is most likely the appropriate signal to undergo baseband processing.

Figure 1:
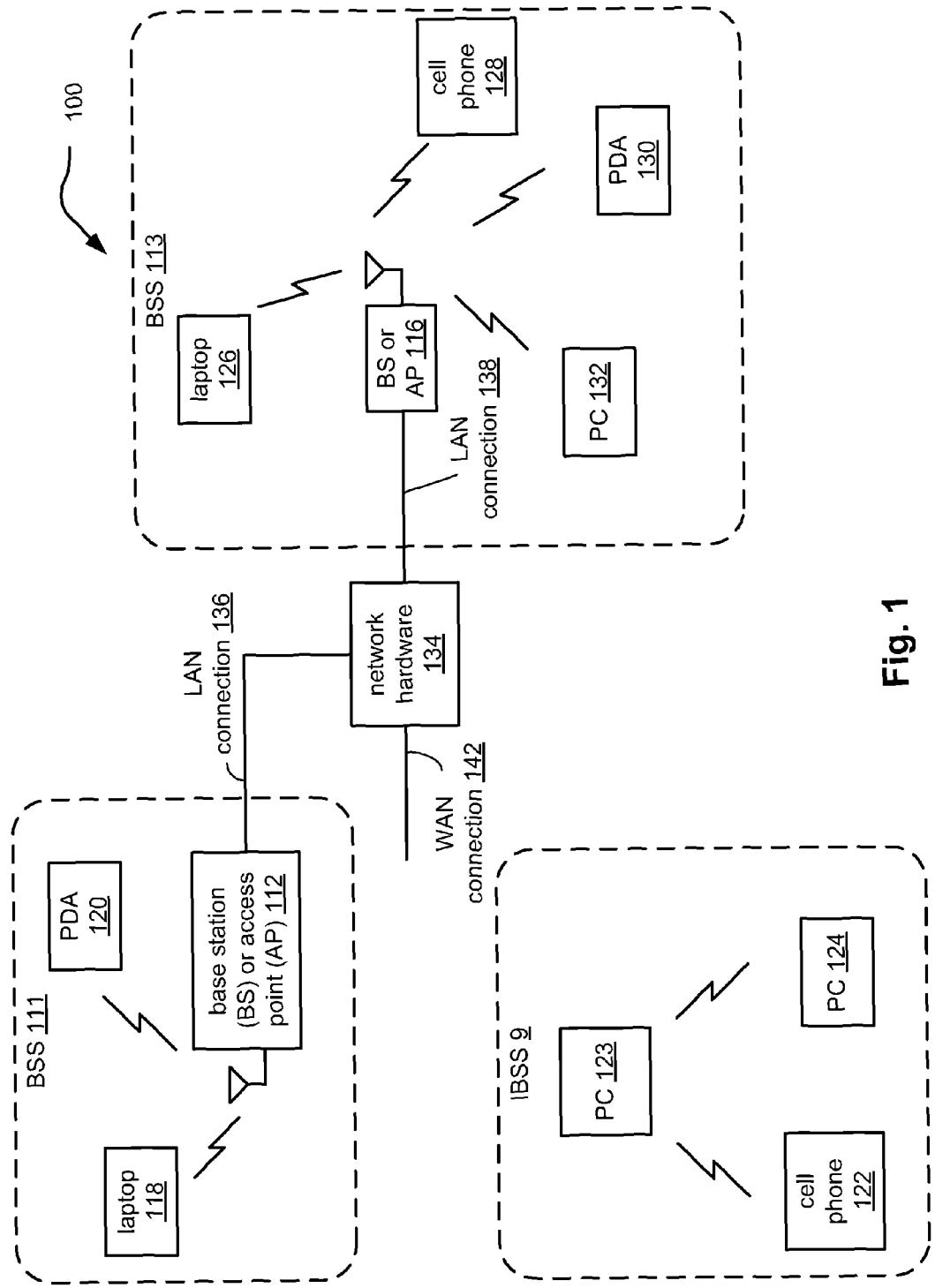
FIG. 1 is a diagram illustrating an embodiment of a wireless communication system.

FIG. 1 is a diagram illustrating an embodiment of a wireless communication system 100. The wireless communication system 100 includes a plurality of base stations and/or access points 112, 116, a plurality of wireless communication devices 118-132 and a network hardware component 134. Note that the network hardware 134, which may be a router, switch, bridge, modem, system controller, et cetera, provides a wide area network connection 142 for the communication system 100. Further note that the wireless communication devices 118-132 may be laptop host computers 118 and 126, personal digital assistant hosts 120 and 130, personal computer hosts 124 and 132 and/or cellular telephone hosts 122 and 128.

Wireless communication devices 122, 123, and 124 are located within an independent basic service set (IBSS) area and communicate directly (i.e., point to point). In this configuration, these devices 122, 123, and 124 may only communicate with each other. To communicate with other wireless communication devices within the system 100 or to communicate outside of the system 100, the devices 122, 123, and/or 124 need to affiliate with one of the base stations or access points 112 or 116.

The base stations or access points 112, 116 are located within basic service set (BSS) areas 111 and 113, respectively, and are operably coupled to the network hardware 134 via local area network connections 136, 138. Such a connection provides the base station or access point 112-116 with connectivity to other devices within the system 100 and provides connectivity to other networks via the WAN connection 142. To communicate with the wireless communication devices within its BSS 111 or 113, each of the base stations or access points 112-116 has an associated antenna or antenna array. For instance, base station or access point 112 wirelessly communicates with wireless communication devices 118 and 120 while base station or access point 116 wirelessly communicates with wireless communication devices 126-132. Typically, the wireless communication devices register with a particular base station or access point 112, 116 to receive services from the communication system 100.

Typically, base stations are used for cellular telephone systems (e.g., advanced mobile phone services (AMPS), digital AMPS, global system for mobile communications (GSM), code division multiple access (CDMA), local multi-point distribution systems (LMDS), multi-channel-multi-point distribution systems (MMDS), Enhanced Data rates for GSM Evolution (EDGE), General Packet Radio Service (GPRS), high-speed downlink packet access (HSDPA), high-speed uplink packet access (HSUPA and/or variations thereof) and like-type systems, while access points are used for in-home or in-building wireless networks (e.g., IEEE 802.11, Bluetooth, ZigBee, any other type of radio frequency based network protocol and/or variations thereof). Regardless of the particular type of communication system, each wireless communication device includes a built-in radio and/or is coupled to a radio.

Figure 2:
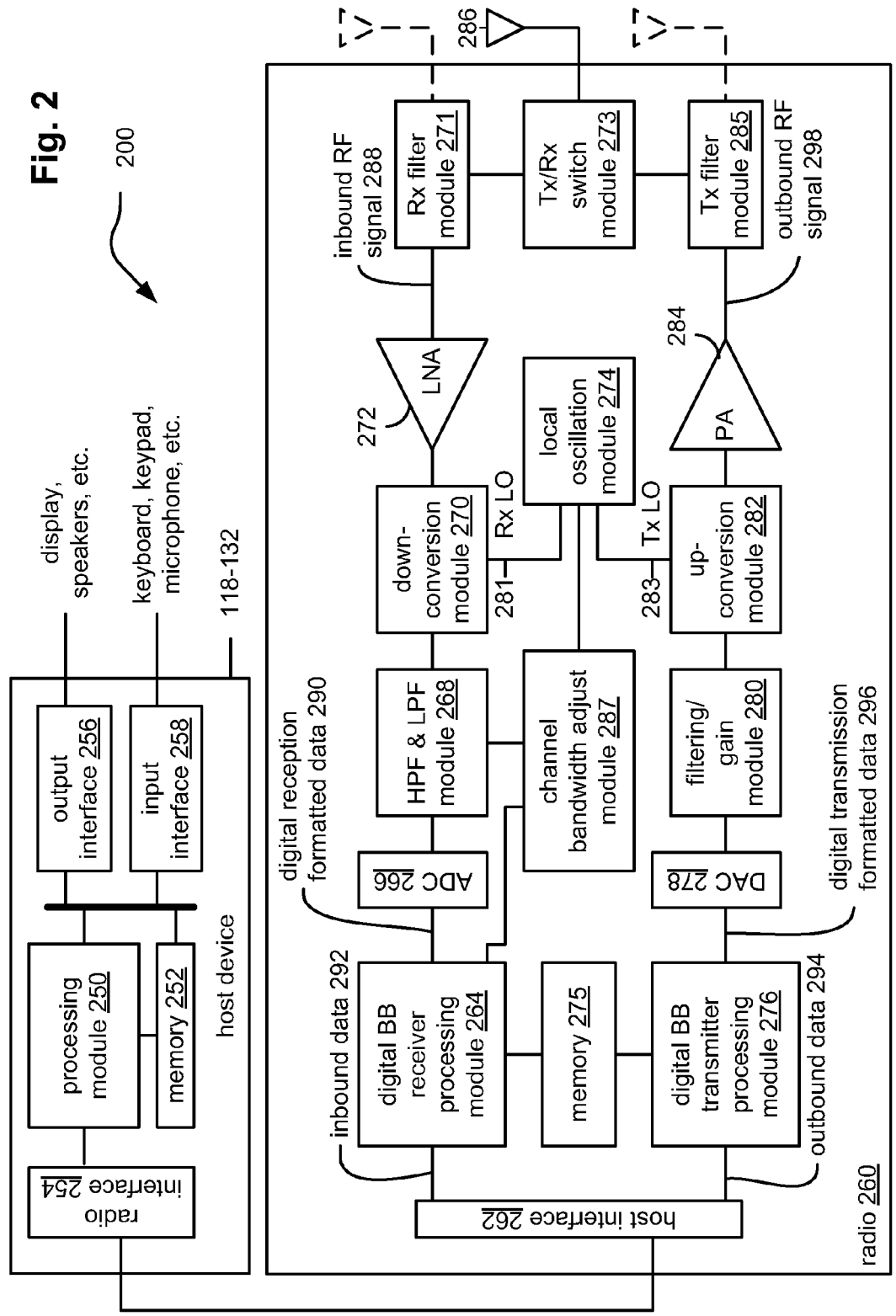
FIG. 2 is a diagram illustrating an embodiment of a wireless communication device.

FIG. 2 is a diagram illustrating an embodiment of a wireless communication device 200 that includes the host device 118-132 and an associated radio 260. For cellular telephone hosts, the radio 260 is a built-in component. For personal digital assistants hosts, laptop hosts, and/or personal computer hosts, the radio 260 may be built-in or an externally coupled component.

As illustrated, the host device 118-132 includes a processing module 250, memory 252, a radio interface 254, an input interface 258, and an output interface 256. The processing module 250 and memory 252 execute the corresponding instructions that are typically done by the host device. For example, for a cellular telephone host device, the processing module 250 performs the corresponding communication functions in accordance with a particular cellular telephone standard.

The radio interface 254 allows data to be received from and sent to the radio 260. For data received from the radio 260 (e.g., inbound data), the radio interface 254 provides the data to the processing module 250 for further processing and/or routing to the output interface 256. The output interface 256 provides connectivity to an output display device such as a display, monitor, speakers, et cetera, such that the received data may be displayed. The radio interface 254 also provides data from the processing module 250 to the radio 260. The processing module 250 may receive the outbound data from an input device such as a keyboard, keypad, microphone, et cetera, via the input interface 258 or generate the data itself. For data received via the input interface 258, the processing module 250 may perform a corresponding host function on the data and/or route it to the radio 260 via the radio interface 254.

Radio 260 includes a host interface 262, digital receiver processing module 264, an analog-to-digital converter 266, a high pass and low pass filter module 268, an IF mixing down conversion stage 270, a receiver filter 271, a low noise amplifier 272, a transmitter/receiver switch 273, a local oscillation module 274, memory 275, a digital transmitter processing module 276, a digital-to-analog converter 278, a filtering/gain module 280, an IF mixing up conversion stage 282, a power amplifier 284, a transmitter filter module 285, a channel bandwidth adjust module 287, and an antenna 286. The antenna 286 may be a single antenna that is shared by the transmit and receive paths as regulated by the Tx/Rx switch 273, or may include separate antennas for the transmit path and receive path. The antenna implementation will depend on the particular standard to which the wireless communication device 200 is compliant.

The digital receiver processing module 264 and the digital transmitter processing module 276, in combination with operational instructions stored in memory 275, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 264 and 276 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 275 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 264 and/or 276 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 260 receives outbound data 294 from the host device via the host interface 262. The host interface 262 routes the outbound data 294 to the digital transmitter processing module 276, which processes the outbound data 294 in accordance with a particular wireless communication standard (e.g., IEEE 802.11, Bluetooth, ZigBee, any other type of radio frequency based network protocol and/or variations thereof et cetera) to produce outbound baseband signals 296. The outbound baseband signals 296 will be digital base-band signals (e.g., have a zero IF) or digital low IF signals, where the low IF typically will be in the frequency range of one hundred kHz (kilo-Hertz) to a few MHz (Mega-Hertz).

The digital-to-analog converter 278 converts the outbound baseband signals 296 from the digital domain to the analog domain. The filtering/gain module 280 filters and/or adjusts the gain of the analog signals prior to providing it to the IF mixing stage 282. The IF mixing stage 282 converts the analog baseband or low IF signals into RF signals based on a transmitter local oscillation 283 provided by local oscillation module 274. The power amplifier 284 amplifies the RF signals to produce outbound RF signals 298, which are filtered by the transmitter filter module 285. The antenna 286 transmits the outbound RF signals 298 to a targeted device such as a base station, an access point and/or another wireless communication device 200.

The radio 260 also receives inbound RF signals 288 via the antenna 286, which were transmitted by a base station, an access point, or another wireless communication device. The antenna 286 provides the inbound RF signals 288 to the receiver filter module 271 via the Tx/Rx switch 273, where the Rx filter 271 bandpass filters the inbound RF signals 288. The Rx filter 271 provides the filtered RF signals to low noise amplifier 272, which amplifies the signals 288 to produce an amplified inbound RF signals. The low noise amplifier 272 provides the amplified inbound RF signals to the IF mixing module 270, which directly converts the amplified inbound RF signals into an inbound low IF signals or baseband signals based on a receiver local oscillation 281 provided by local oscillation module 274. The down conversion module 270 provides the inbound low IF signals or baseband signals to the filtering/gain module 268. The high pass and low pass filter module 268 filters, based on settings provided by the channel bandwidth adjust module 287, the inbound low IF signals or the inbound baseband signals to produce filtered inbound signals.

The analog-to-digital converter 266 converts the filtered inbound signals from the analog domain to the digital domain to produce inbound baseband signals 290, where the inbound baseband signals 290 will be digital base-band signals or digital low IF signals, where the low IF typically will be in the frequency range of one hundred kHz to a few MHz. The digital receiver processing module 264, based on settings provided by the channel bandwidth adjust module 287, decodes, descrambles, demaps, and/or demodulates the inbound baseband signals 290 to recapture inbound data 292 in accordance with the particular wireless communication standard being implemented by radio 260. The host interface 262 provides the recaptured inbound data 292 to the host device 118-132 via the radio interface 254.

As one of average skill in the art will appreciate, the wireless communication device 200 of FIG. 2 may be implemented using one or more integrated circuits. For example, the host device may be implemented on one integrated circuit, the digital receiver processing module 264, the digital transmitter processing module 276 and memory 275 may be implemented on a second integrated circuit, and the remaining components of the radio 260, less the antenna 286, may be implemented on a third integrated circuit. As an alternate example, the radio 260 may be implemented on a single integrated circuit. As yet another example, the processing module 250 of the host device and the digital receiver and transmitter processing modules 264 and 276 may be a common processing device implemented on a single integrated circuit. Further, the memory 252 and memory 275 may be implemented on a single integrated circuit and/or on the same integrated circuit as the common processing modules of processing module 250 and the digital receiver and transmitter processing module 264 and 276.

FIG. 3A is a diagram illustrating an embodiment of low side injection 301 when performing down conversion of a received signal. In this embodiment, a local oscillator (LO) has a frequency that is relatively lower than a radio frequency (RF) of a received signal. Based on this relationship of the LO frequency being relatively lower than the RF, an image generated during down conversion processing will occur in the frequency domain at a location having a negative of the intermediate frequency (IF) of the main signal component. If desired, additional filtering processing can be performed to ensure that no low frequency components of the signal and/or image exist. Alternatively, the IF of the down converted signal can be slightly moved as well.

FIG. 3B is a diagram illustrating an embodiment of high side injection 302 when performing down conversion of a received signal. In this embodiment, a local oscillator (LO) has a frequency that is relatively higher than a radio frequency (RF) of a received signal. Based on this relationship of the LO frequency being relatively higher than the RF, an image generated during down conversion processing will occur in the frequency domain at a location having a higher frequency of the intermediate frequency (IF) of the main signal component. As with the previous embodiment, if desired, additional filtering processing can be performed to ensure that no low frequency components of the signal and/or image exist. Alternatively, the IF of the down converted signal can be slightly moved as well.

Figure 4:
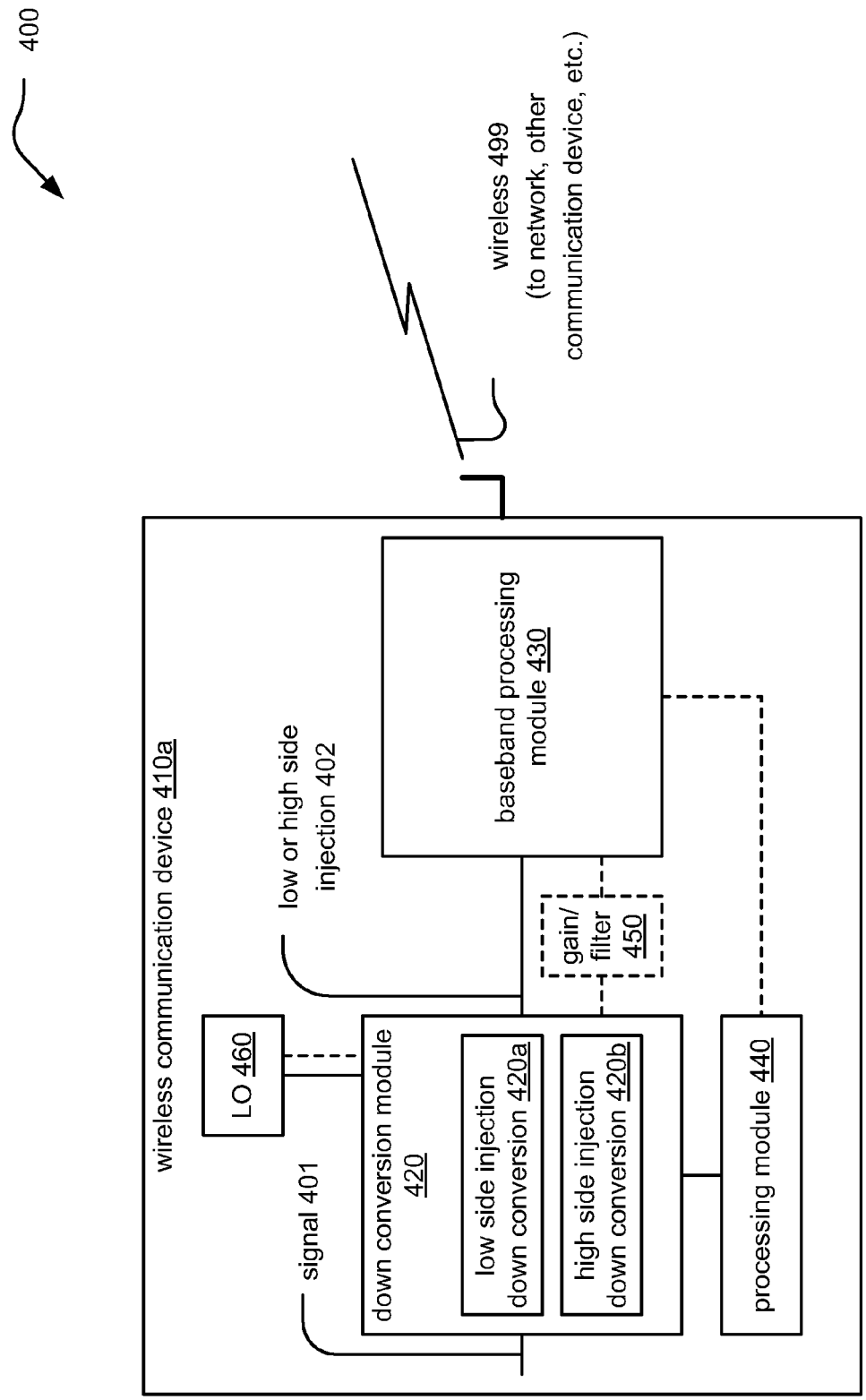
FIG. 4 is a diagram illustrating an alternative embodiment of a wireless communication system including a wireless communication device.

FIG. 4 is a diagram illustrating an alternative embodiment of a wireless communication system 400 including a wireless communication device. The wireless communication system 400 includes a wireless communication device 410a. In some embodiments (e.g., as shown in this diagram), one or more of the modules within the wireless communication device 410a can be implemented within a single integrated circuit. Alternatively, in other embodiments, certain of the various modules can be implemented on a certain number of separate integrated circuit.

The wireless communication device 410a can communicate via a wireless communication channel 499 to a communication network and/or one or more other communication devices. A wireless signal is received by the wireless communication device 410a from the wireless communication channel 499. This wireless signal can undergo a degree of pre-processing (e.g., filtering, gain adjustment, etc.) before providing a signal 401 to a down conversion module 420. The down conversion module 420 is implemented to perform both low side injection down conversion 420a and high side injection down conversion 420b thereby generating two respective down converted signals. More specifically, the low side injection down conversion 420a processes the signal 401 to generate a first down converted signal that includes a first image and a first signal component. Also, the high side injection down conversion 420b processes the signal 401 to generate a second down converted signal that includes a second image and a second signal component.

A local oscillator (LO) 460 can be implemented to generate one or more LO signals to assist in the down conversion processing (e.g., a first LO signal and a second LO signal).

One of the first down converted signal (e.g., low side injection) or the second down converted signal (e.g., high side injection) is provided to a baseband processing module 430, as shown by reference numeral 402. If desired, additional processing (e.g., gain adjustment, filtering, etc. as performed in a module 450) can also be performed on the signal that is provided to the baseband processing module 430.

A processing module 440 is implemented to determine a signal strength of the first image and a signal strength of the first signal component within the first down converted signal. Depending on the relationship of the signal strengths of the first image and the first signal component, the processing module directs the baseband processing module 430 to receive either the first down converted signal (e.g., low side injection) or the second down converted signal (e.g., high side injection).

For example, if the signal strength of the first image is less than and the signal strength of the first signal component based on a first threshold, then the processing module 440 directs the baseband processing module 430 to receive the first down converted signal. Alternatively, if the signal strength of the first image is greater than and the signal strength of the first signal component based on a second threshold, then the processing module 440 directs the baseband processing module 430 to receive the second down converted signal.

It is noted that a same threshold can be performed when doing both comparisons (e.g., the first threshold is the second threshold).

It is also noted that additional considerations can also be performed when deciding whether the first down converted signal (e.g., low side injection) or the second down converted signal (e.g., high side injection) should be provided to the baseband processing module 430.

For example, the processing module 440 can also consider the various relationships of the signal strengths of the second image and the second signal component of the second down converted signal (e.g., high side injection).

At start-up or upon some reset type event, a default selection of one of the first down converted signal (e.g., low side injection) or the second down converted signal (e.g., high side injection) can be selected as being provided to the baseband processing module 430 (e.g., select the first down converted signal (e.g., low side injection) initially and by default at start-up). Thereafter, if it is determined that this is improper signal is selected by default based on the analysis and determination made by the processing module, then the other of the first down converted signal (e.g., low side injection) or the second down converted signal (e.g., high side injection) is selected to subsequently be provided to the baseband processing module 430 (e.g., subsequently select the second down converted signal if the first down converted signal is selected by default or subsequently select the first down converted signal if the second down converted signal is selected by default).

The portion of the signal of the first down converted signal (e.g., low side injection) that was originally provided to the baseband processing module 430 can be discarded. For example, if processing is performed on a packet basis, those packets originally processed by the improperly selected signal can be discarded, and as long as subsequent processing is performed using a sufficient number of subsequent packets, then the discarding of one or a few of the original packets will not cause significantly deleterious effects.

Figure 5:
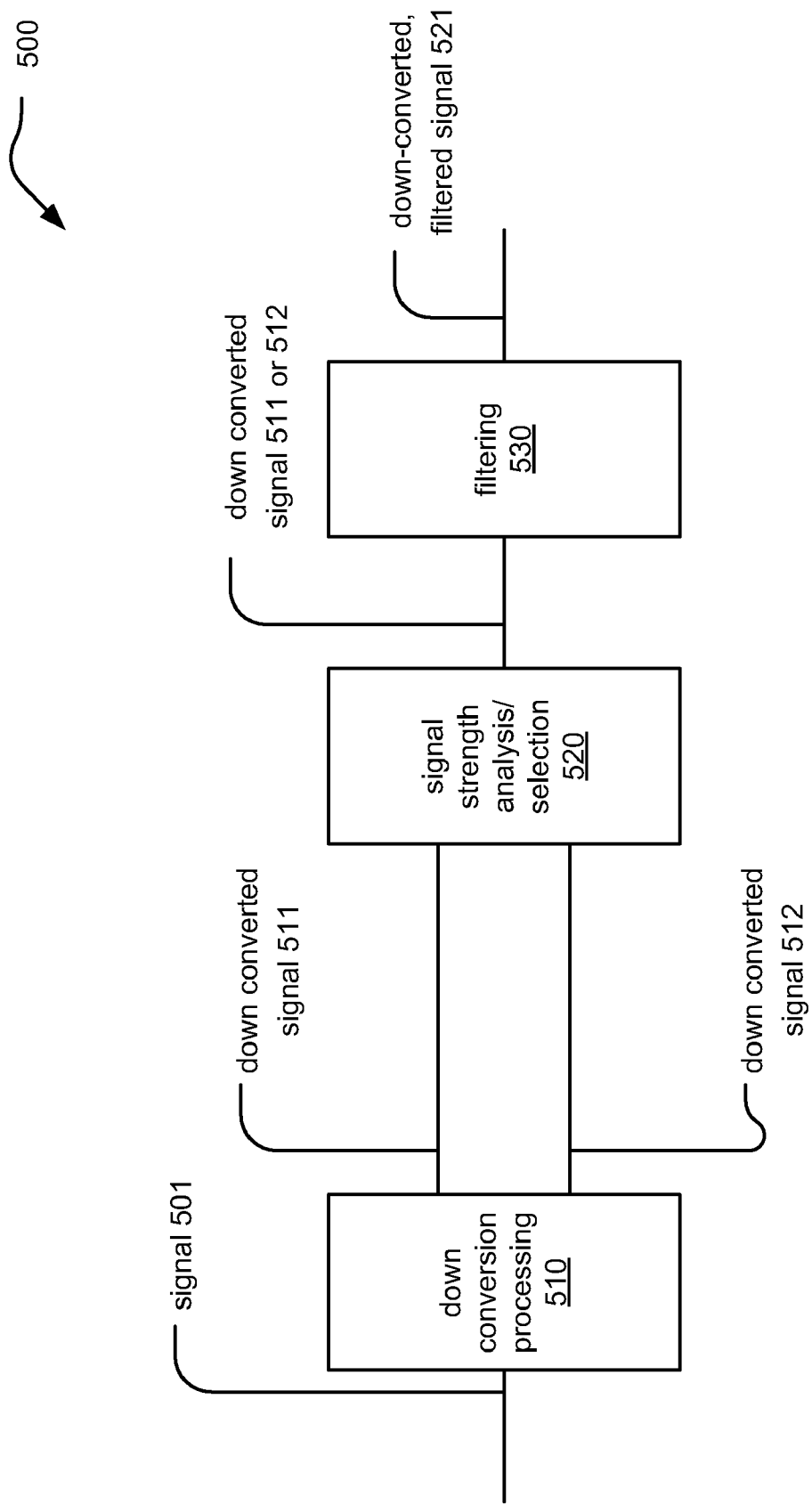
FIG. 5 is a diagram illustrating an embodiment of a dual low side injection and high side injection down conversion processing.

FIG. 5 is a diagram illustrating an embodiment 500 of a dual low side injection and high side injection down conversion processing. A signal 501 undergoes down conversion processing as shown by reference numeral 510 to generate two separate down converted signals 511 and 512. Each of the two separate down converted signals 511 and 512 can have different intermediate frequencies (IFs). Signal strength analysis of these two separate down converted signals 511 and 512 is performed as shown by reference numeral 520. Based on this analysis, one of the two separate down converted signals 511 and 512 is selected and output to undergo subsequent filtering as shown by reference numeral 530 thereby generating a down converted, filtered signal 521.

Figure 6:
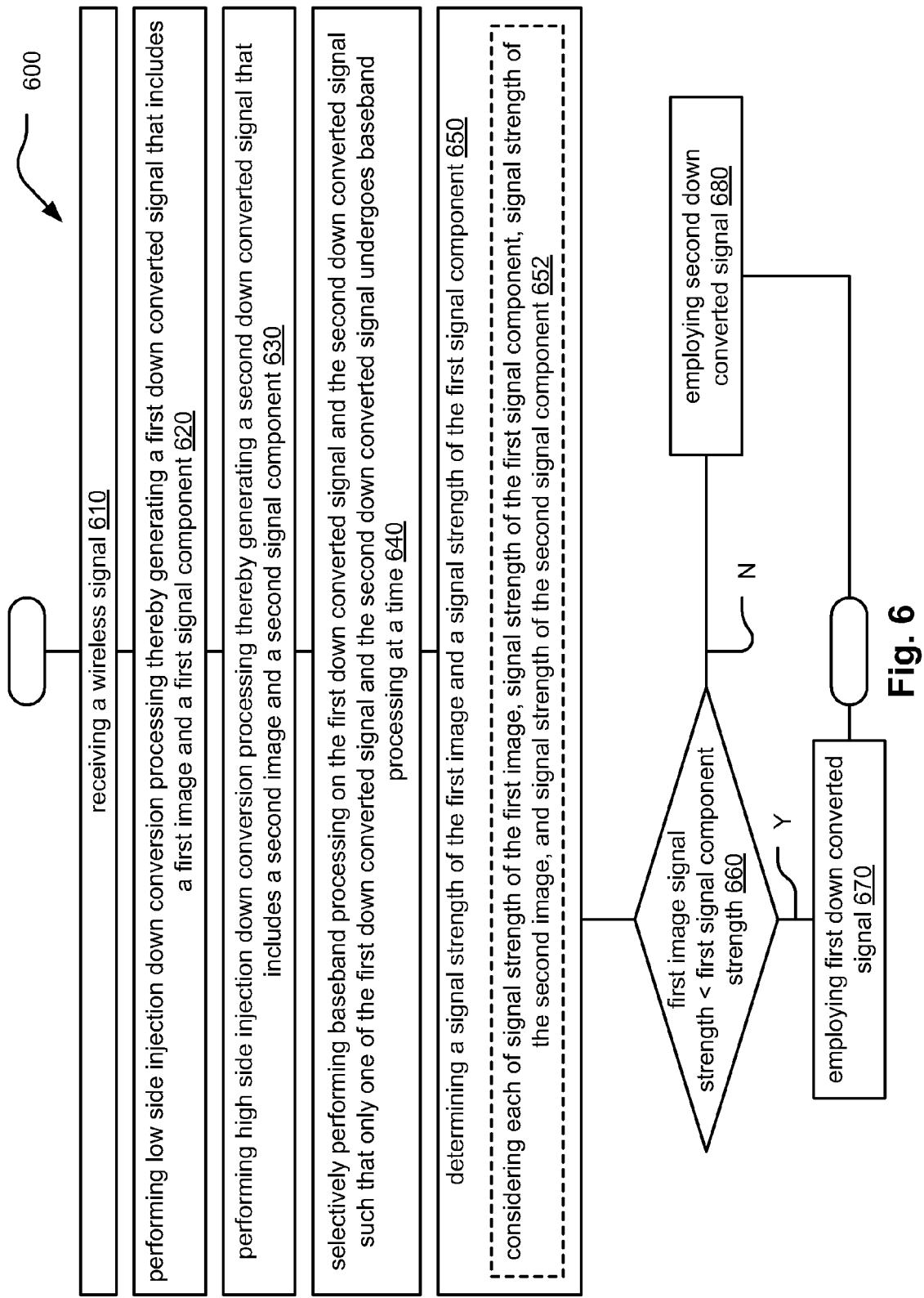
FIG. 6 is a diagram illustrating an embodiment of a method for performing receiver processing.

FIG. 6 is a diagram illustrating an embodiment of a method 600 for performing receiver processing. The method 600 operates by receiving a wireless signal, as shown in a block 610.

The method 600 continues by performing low side injection down conversion processing thereby generating a first down converted signal that includes a first image and a first signal component, as shown in a block 620. The method 600 continues by performing high side injection down conversion processing thereby generating a second down converted signal that includes a second image and a second signal component, as shown in a block 630.

The method 600 continues by selectively performing baseband processing on the first down converted signal and the second down converted signal such that only one of the first down converted signal and the second down converted signal undergoes baseband processing at a time, as shown in a block 640.

The method 600 continues by determining a signal strength of the first image and a signal strength of the first signal component, as shown in a block 650. This determination can be performed by also considering a signal strength of the second image and a signal strength of the second signal component, as shown in a block 652.

As shown in a decision block 660, the method 600 determines whether or not the signal strength of the first image is less than and the signal strength of the first signal component based on a first threshold. In addition or alternatively to, the method 600 can also determine whether or not the signal strength of the first image is greater than and the signal strength of the first signal component based on a second threshold. Each of the first threshold and the second threshold can be the same threshold in some embodiments.

If the signal strength of the first image is less than and the signal strength of the first signal component based on a first threshold, then the method operates by employing the first down converted signal as shown in a block 670. Alternatively, if the signal strength of the first image is greater than and the signal strength of the first signal component based on the first threshold, then the method operates by employing the second down converted signal as shown in a block 680.

It is noted that the various modules (e.g., modules such as processing modules, digital BB receiver or transmitter processing modules, etc.) described herein may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The operational instructions may be stored in a memory. The memory may be a single memory device or a plurality of memory devices. Such a memory device may be a read-only memory, random access memory, volatile memory, non-volatile memory, static memory, dynamic memory, flash memory, and/or any device that stores digital information. It is also noted that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. In such an embodiment, a memory stores, and a processing module coupled thereto executes, operational instructions corresponding to at least some of the steps and/or functions illustrated and/or described herein.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

What is claimed is:

1. A communication device, comprising:
an input that receives a wireless signal;
a down conversion module implemented to:
perform low side injection down conversion processing thereby generating a first down converted signal that includes a first image and a first signal component; and
perform high side injection down conversion processing thereby generating a second down converted signal that includes a second image and a second signal component;

a baseband processing module implemented to receive the first down converted signal or the second down converted signal;
a processing module implemented to:
determine a signal strength of the first image and a signal strength of the first signal component;
if the signal strength of the first image is less than and the signal strength of the first signal component based on a first threshold, then the processing module directs the baseband processing module to receive the first down converted signal; and
if the signal strength of the first image is greater than and the signal strength of the first signal component based on a second threshold, then the processing module directs the baseband processing module to receive the second down converted signal.

2. The communication device of claim 1, wherein:
the first threshold is the second threshold.

3. The communication device of claim 1, further comprising:
a filter implemented to eliminate or reduce at least one of the first image from the first down converted signal and the second image from the second down converted signal.

4. The communication device of claim 1, wherein:
the processing module determines a signal strength of the second image and a signal strength of the second signal component; and
the processing module considers each of the signal strength of the first image, the signal strength of the first signal component, the signal strength of the second image, and the signal strength of the second signal component to determine which of the first down converted signal or the second down converted signal is provided to the baseband processing module.

5. The communication device of claim 1, wherein:
the baseband processing module initially receives the first down converted signal.

6. The communication device of claim 1, wherein:
the baseband processing module processes a plurality of packets corresponding to at least one of the first down converted signal and the second down converted signal; and
the baseband processing module discards at least one packet of the plurality of packets.

7. The communication device of claim 1, wherein:
the baseband processing module processes a plurality of packets corresponding to at least one of the first down converted signal and the second down converted signal;
the baseband processing module initially receives the first down converted signal such that the baseband processing module processes a first packet corresponding to the first down converted signal; and
after the processing module directs the baseband processing module to receive the second down converted signal, the baseband processing module subsequently receives the second down converted signal such that the baseband processing module processes a second packet corresponding to the second down converted signal.

8. The communication device of claim 1, further comprising:
a local oscillator implemented to generate a first local oscillator signal and a second local oscillator signal; and wherein:
when performing the low side injection down conversion processing, the down conversion module employs the first local oscillator signal;
a frequency of the first local oscillator is less than a frequency of the wireless signal;
when performing the high side injection down conversion processing, the down conversion module employs the second local oscillator signal; and
a frequency of the second local oscillator is greater than the frequency of the wireless signal.

9. The communication device of claim 1, further comprising:
a local oscillator implemented to generate a first local oscillator signal; and wherein:
the down conversion module receives the first local oscillator signal;
the down conversion module processes the first local oscillator signal thereby generating a second local oscillator signal;
when performing the low side injection down conversion processing, the down conversion module employs the first local oscillator signal;
a frequency of the first local oscillator is less than a frequency of the wireless signal;
when performing the high side injection down conversion processing, the down conversion module employs the second local oscillator signal; and
a frequency of the second local oscillator is greater than the frequency of the wireless signal.

10. The communication device of claim 1, wherein:
the communication device is a handheld wireless communication device.

11. A communication device, comprising:
an input that receives a wireless signal;
a down conversion module implemented to:
perform low side injection down conversion processing thereby generating a first down converted signal that includes a first image and a first signal component; and
perform high side injection down conversion processing thereby generating a second down converted signal that includes a second image and a second signal component;
a baseband processing module implemented to receive the first down converted signal or the second down converted signal;
a processing module implemented to:
determine a signal strength of the first image and a signal strength of the first signal component;
determine a signal strength of the second image and a signal strength of the second signal component;
if the signal strength of the first image is less than and the signal strength of the first signal component based on a first threshold, then the processing module directs the baseband processing module to receive the first down converted signal; and
if the signal strength of the first image is greater than and the signal strength of the first signal component based on a second threshold, then the processing module directs the baseband processing module to receive the second down converted signal;
a filter implemented to eliminate or reduce at least one of the first image from the first down converted signal and the second image from the second down converted signal; and wherein:
the processing module considers each of the signal strength of the first image, the signal strength of the first signal component, the signal strength of the second image, and the signal strength of the second signal component to determine which of the first down converted signal or the second down converted signal is provided to the baseband processing module.

12. The communication device of claim 11, wherein:
the baseband processing module processes a plurality of packets corresponding to at least one of the first down converted signal and the second down converted signal; and
the baseband processing module discards at least one packet of the plurality of packets.

13. The communication device of claim 11, wherein:
the baseband processing module processes a plurality of packets corresponding to at least one of the first down converted signal and the second down converted signal;
the baseband processing module initially receives the first down converted signal such that the baseband processing module processes a first packet corresponding to the first down converted signal; and
after the processing module directs the baseband processing module to receive the second down converted signal, the baseband processing module subsequently receives the second down converted signal such that the baseband processing module processes a second packet corresponding to the second down converted signal.

14. The communication device of claim 11, further comprising:
a local oscillator implemented to generate a first local oscillator signal and a second local oscillator signal; and wherein:
when performing the low side injection down conversion processing, the down conversion module employs the first local oscillator signal;
a frequency of the first local oscillator is less than a frequency of the wireless signal;
when performing the high side injection down conversion processing, the down conversion module employs the second local oscillator signal; and
a frequency of the second local oscillator is greater than the frequency of the wireless signal.

15. The communication device of claim 11, further comprising:
a local oscillator implemented to generate a first local oscillator signal; and wherein:
the down conversion module receives the first local oscillator signal;
the down conversion module processes the first local oscillator signal thereby generating a second local oscillator signal;
when performing the low side injection down conversion processing, the down conversion module employs the first local oscillator signal;
a frequency of the first local oscillator is less than a frequency of the wireless signal;
when performing the high side injection down conversion processing, the down conversion module employs the second local oscillator signal; and
a frequency of the second local oscillator is greater than the frequency of the wireless signal.

16. The communication device of claim 11, wherein:
the communication device is a handheld wireless communication device.

17. A method for performing receiver processing, the method comprising:
receiving a wireless signal;
performing low side injection down conversion processing thereby generating a first down converted signal that includes a first image and a first signal component;
performing high side injection down conversion processing thereby generating a second down converted signal that includes a second image and a second signal component;
selectively performing baseband processing on the first down converted signal and the second down converted signal such that only one of the first down converted signal and the second down converted signal undergoes baseband processing at a time;
determining a signal strength of the first image and a signal strength of the first signal component;
if the signal strength of the first image is less than and the signal strength of the first signal component based on a first threshold, then directing the baseband processing module to receive the first down converted signal; and
if the signal strength of the first image is greater than and the signal strength of the first signal component based on a second threshold, then directing the baseband processing module to receive the second down converted signal.

18. The method of claim 17, wherein:
determining a signal strength of the second image and a signal strength of the second signal component; and
considering each of the signal strength of the first image, the signal strength of the first signal component, the signal strength of the second image, and the signal strength of the second signal component to determine which of the first down converted signal or the second down converted signal is to undergo baseband processing.

19. The method of claim 17, wherein:
performing baseband processing of a plurality of packets corresponding to at least one of the first down converted signal and the second down converted signal; and
discarding at least one packet of the plurality of packets.

20. The method of claim 17, wherein:
the method is performed within a communication device; and
the communication device is a handheld wireless communication device.

* * * * *

UNITED STATES PATENT AND TRADEMARK OFFICE
CERTIFICATE OF CORRECTION

| | | |
|---|---|---|
| PATENT NO. | : 7,904,042 B2 | Page 1 of 1 |
| APPLICATION NO. | : 12/028436 | |
| DATED | : March 8, 2011 | |
| INVENTOR(S) | : Hooman Darabi | |

It is certified that error appears in the above-identified patent and that said Letters Patent is hereby corrected as shown below:

Col. 11, line 7, in claim 1: after "less than" delete "and"
Col. 11, line 12, in claim 1: after "greater than" delete "and"
Col. 12, line 50, in claim 11: after "less than" delete "and"
Col. 12, line 55, in claim 11: after "greater than" delete "and"
Col. 14, line 26, in claim 17: after "less than" delete "and"
Col. 14, line 29, in claim 17: after "greater than" delete "and"

Signed and Sealed this
Second Day of October, 2012

David J. Kappos
*Director of the United States Patent and Trademark Office*